United States Patent [19]

Flanders et al.

[11] Patent Number: 5,503,951
[45] Date of Patent: Apr. 2, 1996

[54] ATTENUATING PHASE-SHIFT MASK STRUCTURE AND FABRICATION METHOD

[75] Inventors: Steven D. Flanders, Winooski; David S. O'Grady, Jericho, both of Vt.

[73] Assignee: International Business Machines Corp., Armonk, N.Y.

[21] Appl. No.: 425,667

[22] Filed: Apr. 17, 1995

Related U.S. Application Data

[63] Continuation of Ser. No. 194,892, Feb. 14, 1994, abandoned.

[51] Int. Cl.$^6$ ........................................... G03F 9/00
[52] U.S. Cl. ........................... 430/5; 430/314; 430/322; 430/323; 430/324
[58] Field of Search ........................... 430/5, 311, 313, 430/314, 322, 323, 324

[56] References Cited

U.S. PATENT DOCUMENTS

| | | | |
|---|---|---|---|
| 4,707,218 | 11/1987 | Giammarco et al. | 156/643 |
| 4,885,231 | 12/1989 | Chan | 430/321 |
| 5,087,535 | 2/1992 | Hirikane et al. | 430/5 |
| 5,112,727 | 5/1992 | Inui et al. | 430/321 |
| 5,147,812 | 9/1992 | Gilbert et al. | 437/41 |
| 5,225,035 | 7/1993 | Rolfson et al. | 156/643 |
| 5,288,569 | 3/1994 | Lin | 430/311 |

FOREIGN PATENT DOCUMENTS 0234547  9/1987  European Pat. Off. .

OTHER PUBLICATIONS

Burn J. Lin "The Attenuated Phase–Shift Mask" Jan., 1992 Sold State Technology pp. 41–47.

Levenson et al., "Improving Resolution in Photolithography with a Phase–Shifting Mask," Dec. 1982, IEEE Transactions on Electron Devices, vol. Ed–29, No. 12, pp. 18–36.

Todokoro et al., "Self–Aligned Phase Shifting Mask for Contact Hole Fabrication," 1991, Microelectronic Engineering, No. 13, pp. 131–134.

Ishiwata et al., "Fabrication of Phase–Shifting Mask," 1991, Proceedings of the SPIE, vol. 1463, pp. 423–433.

*Primary Examiner*—S. Rosasco
*Attorney, Agent, or Firm*—Thornton & Thornton; Lawrence Meier

[57] ABSTRACT

An attenuating, phase-shift, semiconductor fabrication mask having recessed attenuating and phase-shifting regions that is not susceptible to phase defects in the printing regions of the mask. This desirable result is accomplished by not altering the surface of the fully transmissive regions of the mask and by recessing the attenuating regions of the mask relative to the fully transmissive regions.

A method of forming the recessed attenuated phase-shift mask is also included. The process begins by forming recesses in the regions of the mask substrate where phase-shifting is desired and back filling these recessed regions with a selected thickness of attenuating material so that the attenuation effect of the deposited material together with the depth of the recess co-act to shift the light approximately 180° ($\pi$ radians) from the light transmitted through the adjacent transmissive regions of the mask to create by destructive interference a sharp delineation at the edges of the projected mask image.

18 Claims, 3 Drawing Sheets

ATTENUATING PHASE-SHIFT MASK STRUCTURE AND FABRICATION METHOD

The application is a continuation of application Ser. No. 08//194,892, filed Feb. 14, 1994, now abandoned.

FIELD OF THE INVENTION

This invention relates to phase-shift lithography and, more particularly, to an improved attenuating phase-shift mask having recessed attenuating regions and methods of fabricating such mask.

BACKGROUND OF THE INVENTION

Photo-lithography is widely used in the semiconductor industry to form a wide range of structures in integrated circuit chips. As the size of the chips decrease and their density increases, optical phenomena, such as diffraction, interference and light divergence, becomes increasingly important for they can adversely affect the resolution of the photolithography rendering further reduction in size and increases in density more difficult to realize.

To minimize the importance of such phenomena and extend the range of photolithography a technique known as phase-shift, based on phase destructive interference of the waves of incident light, was developed.

Phase-shift lithography shifts the phase of one region of incident light waves approximately 180° ($\pi$ radians) relative to an adjacent region of incident light waves to create a more sharply defined interface between the adjacent regions than is otherwise possible.

when phase-shifting is used with semiconductor photomasks the boundary between exposed and unexposed portions of a photoresist exposed through the mask is more closely defined. By more closely defining the boundaries, the circuit created thereby can be smaller and closer. Thus, a greater circuit density can be realized.

A number of phase-shift lithography techniques have been developed. One of the earliest is reported by Levenson et al. in the article entitled "Improved Resolution in Photolithography with a Phase-shifting Mask" *IEEE TRANSACTIONS ON ELECTRON DEVICES*, Vol. ED-29 No. 12, December 1982, Pages 18–36. The technique disclosed in this article uses a periodic pattern arrangement in the transmission mask and provides a sharp image contrast. Practical semiconductor integrated circuit masks using the described technique are however difficult to fabricate for the mask openings must be arranged in a periodic fashion. Such periodic arrangements are generally not suitable for the more complex, present day, integrated semiconductor circuits.

In an attempt to avoid the relatively complex mask fabrication techniques required by the Levenson approach, an alternative process known as the self aligned or rim type phase-shift process was developed and has been reported by Todokoro et al. in an article entitled "Self-aligned Phase-shifting Mask for Contact Hole Fabrication" appearing in *MICROELECTRONIC ENGINEERING*, No. 13, 1991, Pages 131–134 and by Ishiwata et al. in the article entitled "Fabrication of Phase-shifting Mask." which appeared in the *PROCEEDINGS OF THE SPIE*, Vol. 1463, 1991, Pages 423–433.

Although such rim phase-shifting masks are thus inherently applicable to arbitrary masks patterns and overcome the limitations of the Levenson approach, they are also limited for they require a large positive mask bias to reduce exposure times to reasonable levels and also have strong proximity effects. This makes it difficult to utilize single mask patterns designed to expose in a single common exposure a variety of feature sizes and shapes.

To overcome the above described limitations of rim phase-shifting masks, the attenuated phase-shifting mask was developed, as reported by Burn J. Lin in an Article entitled "The Attenuated Phase-Shifting Mask" that appeared in the January 1992 Issue of *SOLID STATE TECHNOLOGY*, Pages 43–47.

Phase-shift lithography, including attenuating phase-shift lithography, is thus based on and takes advantage of the well known opposite phase, destructive interference phenomena to more clearly delineate fine images.

The attenuated phase-shifting masks described by Lin replace the opaque parts of the prior art masks with a slightly phase-shifting transmissive absorber, i.e., an attenuating material, which will provide an approximately 180° ($\pi$ radians) phase-shift characteristic as contrasted to the adjacent fully transmissive adjacent areas. This absorber is deposited on the surface of the mask adjacent the fully transmissive areas of the mask. These attenuated phase-shift masks require only a small positive mask bias resulting in improved resolution and shorter exposures and, compared with rim phase-shifting masks, have a greater depth of focus, and use less mask areas. However, these attenuated phase-shifting masks, although appreciably better than the rim type phase-shifting masks, are susceptible to process created phase defects in the printing regions of the mask.

Furthermore, not all absorbers can both phase-shift and absorb by the desired amount without first modifying the surface of the substrate to provide, in the absorbing or attenuating regions, an additional transparent phase-shifting layer that will compensate for the insufficient phase-shifting of the absorber. This modification of the surface however requires a treatment, such as etching of the surface of the printing or fully transmissive areas of the substrate, which introduces the undesirable, process created, phase defects discussed above.

Accordingly, there now exists a need for an improved attenuating mask which is not susceptible to undesirable phase defects in the printing areas of the mask while still providing all the advantages that the attenuation masks have over all other types of phase-shifting masks.

SUMMARY OF THE INVENTION

An object of the present invention is to provide an improved attenuating phase-shifting mask that is not susceptible to phase defects in the printing regions of the mask while still providing all the advantages that attenuation masks have over all other types of phase-shifting masks.

It is another object of the invention to provide a phase-shift mask which has improved aerial image projection.

It is still another object of the invention to provide a phase-shift mask structure that is fully repairable using conventional repair techniques now practiced in the semiconductor mask making art.

It is yet another object of the invention to provide a method of fabricating the phase-shifting mask structure of the present invention using conventional mask materials and mask masking techniques.

It is a further object of the present invention to provide a method of making the mask of the present invention such that the mask is not susceptible to phase defect formation during the fabrication process.

These desirable results and other objects of the present invention are realized and provided by recessing the attenuating regions of the mask relative to the fully transmissive or printing regions. The recessing of these attenuating regions is accomplished by a process of etching the recesses in those regions of the mask substrate where phase-shifting is desired followed by back filling the recesses with a selected thickness of attenuating material so that the deposited material together with the depth of the recess co-act to shift the light, i.e., between 160° and 200°, sufficient to cause destructive interference with refracted light emitted from the adjacent transmissive regions of the mask.

These and other objects, features, and advantages of the invention will be apparent from the following more particular description of the preferred embodiment of the invention as illustrated in the accompanying drawings.

DESCRIPTION OF THE PREFERRED EMBODIMENT

Basically, the present invention, as will be more fully set forth below, is an attenuating phase-shift photomask consisting of slightly transmissive or attenuating regions located adjacent fully transmissive regions so that a 180° ($\pi$ radians) phase-shift difference exists between the fully transmitted light and the attenuated light. The light that becomes diffracted as it passes through the fully transmissive or unblocked regions is destructively interfered with by the light passing through the partially blocked or attenuated regions thus sharply defining the image edges and contrast in the aerial image without requiring redesign of the image or large image bias. These advantages thus make the present invention applicable to both present and future images.

Figure 6:
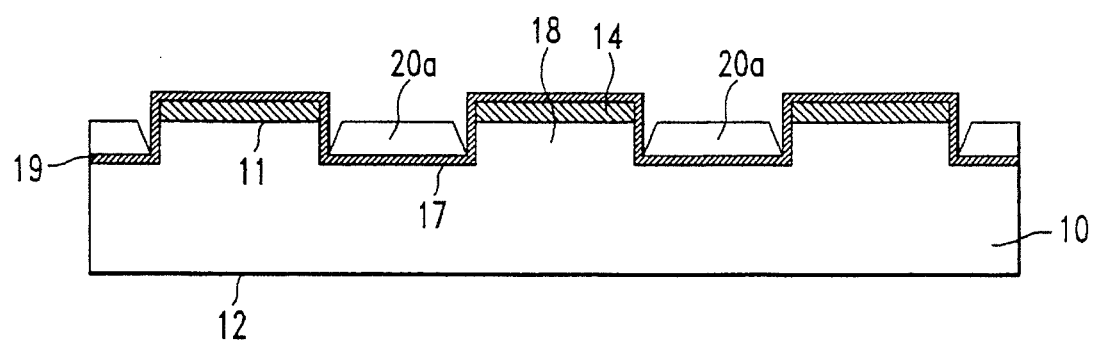
FIG. 6 shows the blank of FIG. 5 with the photoresist layer exposed and developed.
Figure 7:
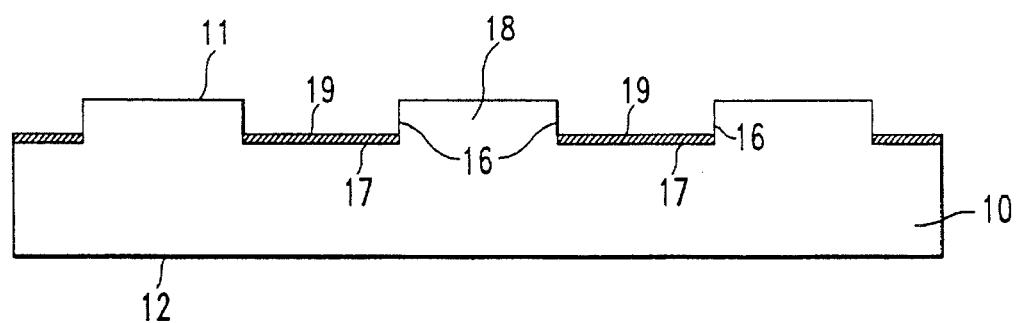
FIG. 7 shows the blank FIG. 6 fully processed and existing as a phase defect free, attenuating mask useful for the fabrication of a integrated circuit.

Referring now to the drawings and especially FIGS. 1 to 7, the attenuated, optical phase-shift, photomask of the present invention, suitable for use in the production of semiconductor integrated circuit chips, and a method of making it, will be described. FIGS. 1 through 6 are sectional views showing a preferred manufacturing process for producing the present invention. FIG. 7 shows the attenuating mask, of the present invention, created by the processing steps described in conjunction with FIGS. 1 to 6.

Figure 1:
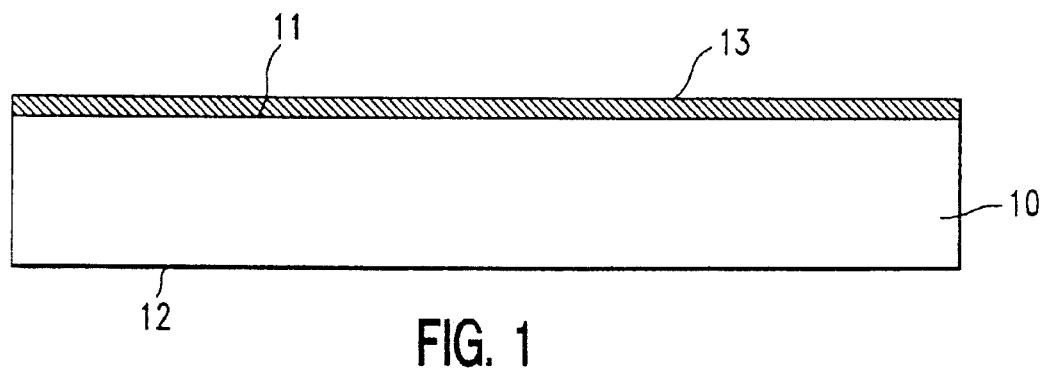
FIG. 1 shows an optically flat photomask blank having a chrome layer thereon.

FIG. 1 shows an optically flat and optically transmissive photomask blank 10 typically having a thickness of between 50 and 500 mm (millimeters) and substantially parallel major surfaces 11 and 12. Quartz or borosilicate glass is the preferred material for the blank 10 when optical wavelengths are to be transmitted therethrough. Quartz is especially preferred not only because of its low thermal expansion coefficient but also because it is very transparent, i.e., has a high light transmissivity, to the deep ultra-violet (i.e., having a wavelength between 180 and 400 nanometers), the ultra-violet the visible spectrum and to infra-red below 7 microns. Transmissivity is the ratio of the transmitted light, passing through a definite thickness of the material, to the incident light. As used herein, a high tranmissivity material is one that transmits 50% or more of the incident light and a low transmissivity or attenuating material is one that transmits 35% or less of the incident light. For example, in the deep ultra-violet range for light with a wave length of 190 nanometers, the transmission factor or transmissivity for a 1 mm thick quartz blank is about 67% and for 220 nanometer light the transmissivity is 94%. It should of course be understood that other materials having the necessary characteristics such as a suitable refractive index and transmissivity can be used.

Disposed on top surface 11 is a blocking layer 13 through which no substantial amount, i.e., less than 0.01 percent, of the optical radiation of interest can pass. This blocking layer is therefore substantially opaque Preferably this blocking layer is a metal and is formed by chemical or vapor phase deposition techniques. However, it should be understood that any material can be used so long as (1) it is compatible with the chemicals used in the mask fabrication process and, (2) when laid down in the thinnest layer possible will support a sharp definition of the image to be created in the mask, while remaining opaque to the radiation needed to define the mask image. In present mask making process, a layer of chromium 100 to 10,000 Å in thickness would be suitable. Chromium is especially preferred due to its wide use in the semiconductor mask making industry and because there is available a large body of information regarding its characteristics together with equipment for various methods of its deposition, etching, inspection and repair. Other suitable materials for layer 13 include compounds of molybdenum, aluminum, tungsten, titanium and various types of chromium oxide in appropriate thicknesses. The material selected and its thickness will vary as necessary to meet the required processing steps necessary to create the mask.

Figure 2:
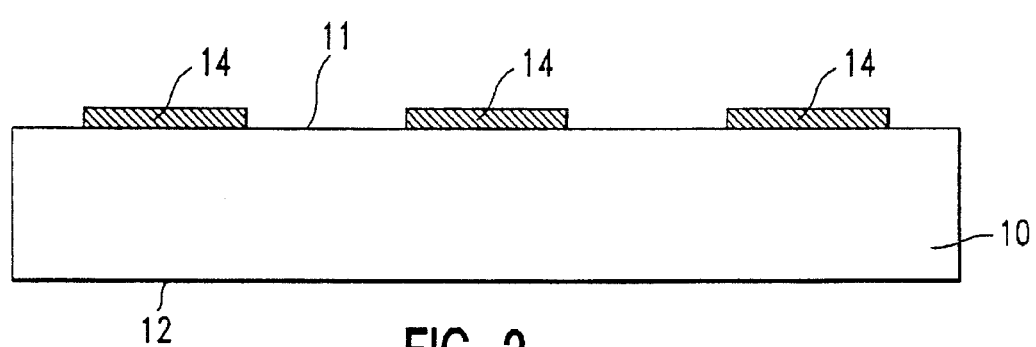
FIG. 2 shows the blank of FIG. 1 with the chrome layer defined into separate islands.
Figure 3:
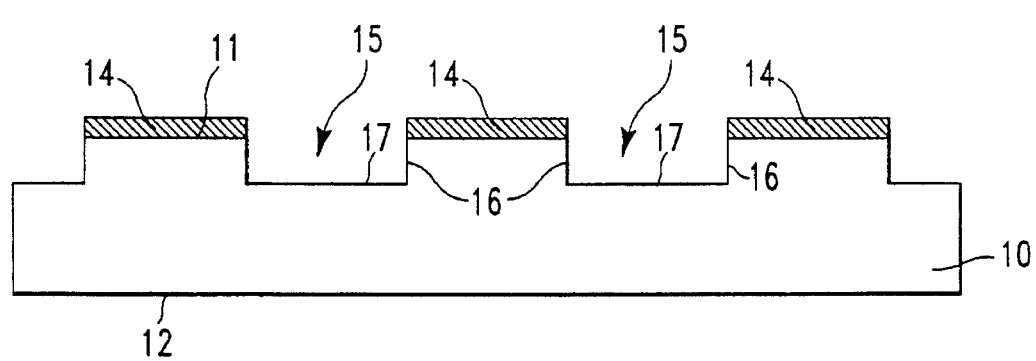
FIG. 3 shows the blank of FIG. 2 with recesses formed adjacent the separate chrome islands.

Once deposited, this layer 13 is, as shown in FIG. 2, defined into selected regions 14 by known masking (e.g., photoresist masking) and etching techniques. Reactive ion etching (RIE) using a chlorine and oxygen ambient is preferred for defining the regions 14. The configuration of the chrome regions 14 is, in the present example, the negative of the final pattern to be formed in the finished mask. Once the regions 14 have been defined they are fully inspected and, if necessary, repaired using conventional and well known mask inspection and repair techniques. These techniques involve removing unwanted material and replacing missing material where needed As illustrated in FIG. 3, the areas of surface 11 unprotected by the chrome regions 14 are now etched to create recesses 15 in surface 11. These recesses 15 have vertical sidewalls 16 and substantially flat bottoms 17. The creation of these recesses 15 leaves the chrome areas 14 on lands 18 which are raised above the bottoms 17 of the recesses 15. The recessed regions 15 are preferably formed using an anisotropic reactive ion etching (RIE) process that will etch the exposed quartz substrate without etching or under cutting the chrome areas 14. Reactive ambients such as a halogen or a halogen based compound may be used, with materials such as fluorine, or carbon tetraflouride (CF$_4$) or carbon Trifluoride (CHF$_3$) being especially preferred for etching quartz without etching the chrome. The chrome 14 being unaffected by these RIE etchants thus not only protects the underlying original surface 11 but also defines the width of the recesses 15. As a result of the anisotropic nature of this RIE process, the sidewalls 16 of the recesses 15 are sharply defined and are substantially perpendicular to the surface 11.

Once the recesses 15 are formed an attenuator, i.e., a low transmissivity material, in the form of layer 19, is deposited over the entire exposed upper surface of the structure shown in FIG. 3. This attenuating layer 19 may be created by any suitable technique, such as sputtering or chemical vapor deposition, that will form the deposit not only on the horizontal surfaces, i.e., the surface of chrome layers 14 and the bottoms 17 of recesses 15 but also over the sidewalls 16 of the recesses 15. This layer 19 may be formed of any material that in a suitable thickness will attenuate the light of interest, i.e., reduce its intensity, to between 1% and 35% of its original value. In the present embodiment, layer 19 is a 300 Å thick layer of chromium oxide, known in the art as a leaky chrome layer, which will attenuate deep ultra-violet light, having a wavelength of between 100 and 400 nm, to between about 6 and 10% of its original value with the preferred range falling between 7 and 8%.

Figure 8:
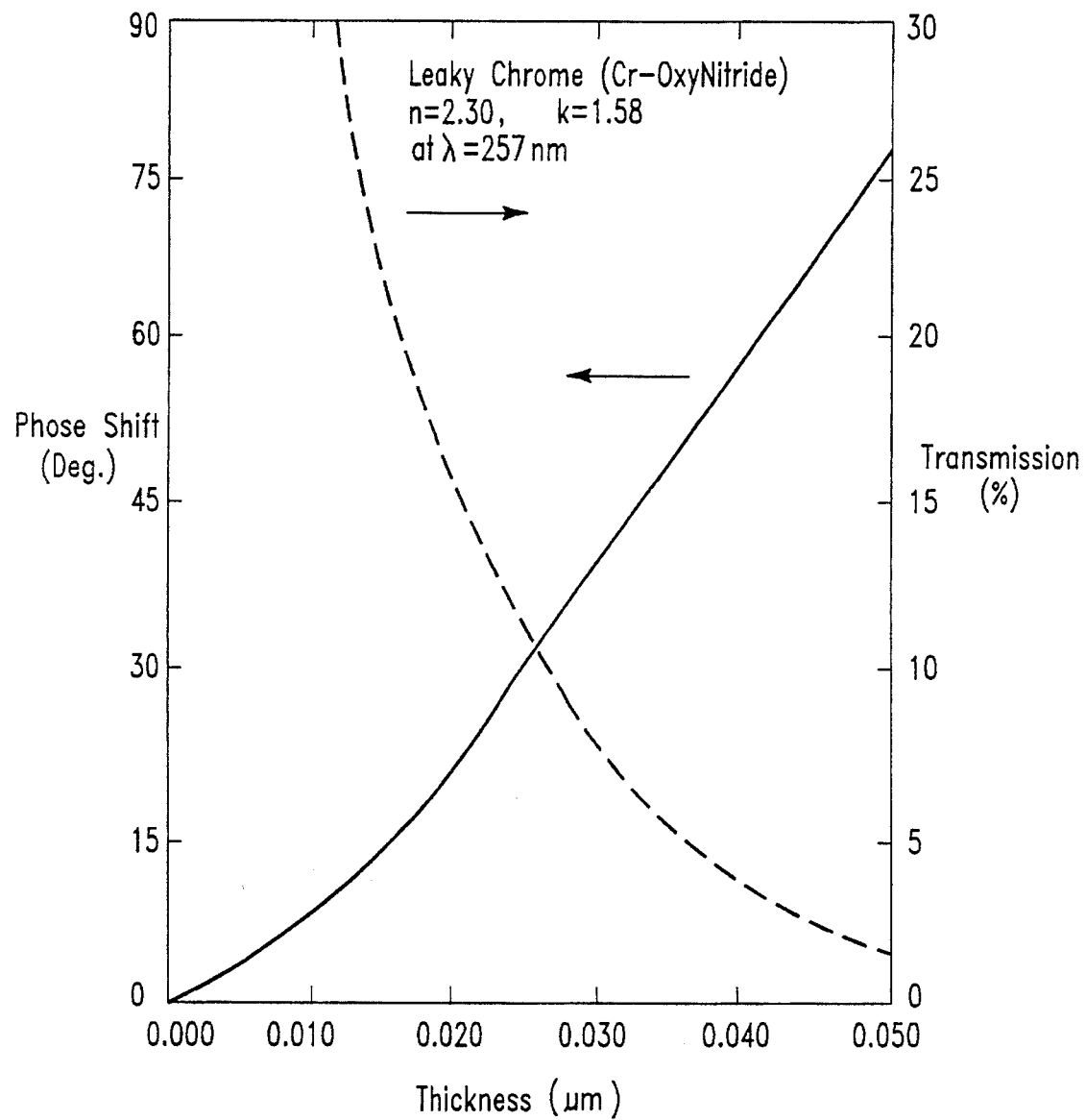
FIG. 8 is a graph showing the relationship between the phase-shift (in radians), the transmission (in percent) and the thickness microns of a typical chrome oxide type film.

The formation of such leaky chrome layers is presently widely practiced in the semiconductor art and may include doping with other materials such as nitrogen to form chrome oxynitride layers. Such leaky chrome layers not only attenuate the incident light but also induce a phase-shift therein so that the transmitted light is shifted by an amount as indicated in FIG. 8. This FIG. 8 shows the relationship between the phase-shift (in degrees), the transmission (in percent) and the thickness (in microns) of a typical chrome oxide type film at a selected wavelength as may be used with the present invention. In this FIG. 8 the solid line and the dashed lines are theoretical calculations for when the film has an index of refraction (n)=2.30 and an optical density (k)=1.58 for light having a wavelength of 257 nanometers. The solid line indicates the extent of phase shift for a given film thickness and the dotted line indicates the extent of light transmission for a given thickness.

It should be noted that the measured amounts may vary from the theoretical values due to variations in the apparatus, materials and processes used to produce layer 19. Thus it is advisable to measure the characteristics of the actual layer that will be laid down. In the present invention the deposited layer 19 (300 Å thick, leaky chrome) was measured and found not only to attenuate the light to between 7 and 8% of the incident light but to also introduce a phase-shift of 40° to the light passing therethrough.

Figure 4:
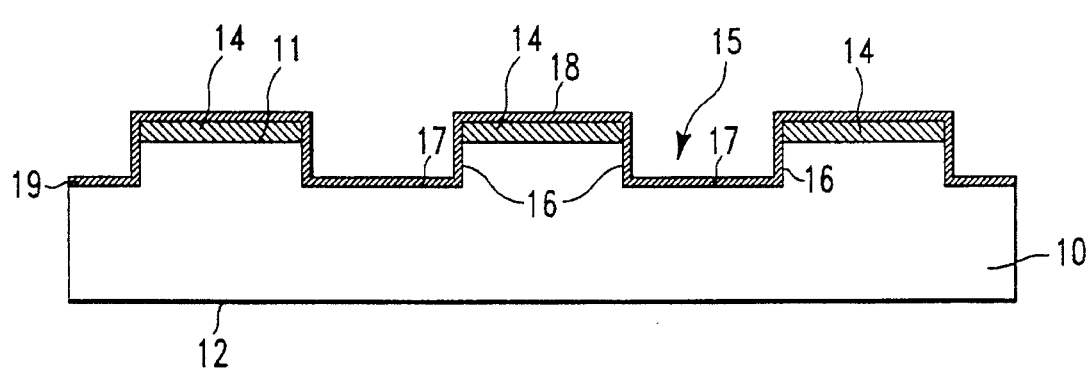
FIG. 4 shows the blank of FIG. 3 with an attenuating layer disposed thereon.
Figure 5:
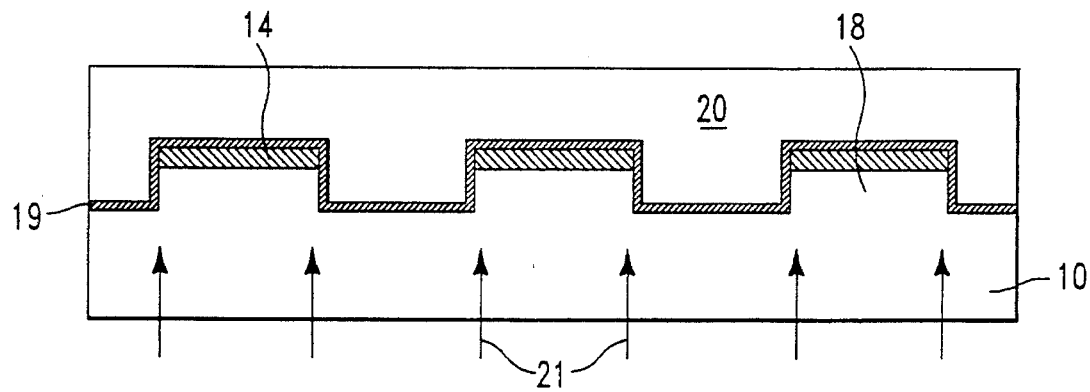
FIG. 5 shows the blank of FIG. 4 overcoated with a layer of photoresist.

Once layer 19 is deposited in the desired thickness to achieve the desired transmission and phase-shift characteristics the structure of FIG. 4 is now spin coated with any suitable negative working photoresist layer 20 such as sold by the Shipley Co. under the designation SAL601. The substrate 10 is now flooded, from its bottom side 12, with light, indicated by arrows 21 in FIG. 5, of a frequency which will activate the photoresist. By taking advantage of the transmission difference between the blocking and attenuating material the process has been found to be not only controllable but also well suited for easy manufacturing. The chromium layer 14, being opaque, blocks substantially all, i.e., greater that 99.9%, of the light, thus preventing the overlying photoresist from being exposed while the attenuating layer 19 in the bottom of the recesses 15 permits sufficient light to pass therethrough so as to expose the photoresist in the recesses 15. This is an important feature in the fabrication of the recessed attenuating masks of the invention.

Once the resist layer 20 has been exposed it is baked and developed causing the unexposed resist, overlying the chromium 14, to be removed while leaving exposed resist 20a in the recesses 15. The structure following this step is shown in FIG. 6. As shown, the unexposed resist overlying the chrome 14 has been removed but those pockets of resist 20a overlying the recesses 15, which were exposed through the attenuating layer 19, remain. Following the development and removal of the unexposed areas of the photoresist layer 20, those portions of the chromium oxide layer 19, exposed by the development of the photoresist, are removed, along with the underlying chrome regions 14 atop lands 18. This removal of the exposed portions of layer 19 and chromium layers 14 can be accomplished by any convenient and appropriate wet or dry etching process as is well know to the semiconductor art. This removal of the unprotected portions of layer 19 leaves only the bottom 17 of the recesses 15 coated with attenuating material 19. Once this etching step is completed the remaining resist 20a in the recesses 15 is stripped, by know processes, from the bottom of the recesses 15 leaving the finished mask as shown in FIG. 7. Conventional inspection and repair techniques are again used to assure the attenuating layers are as designed. Once the mask has been inspected and repaired it can placed in service.

To achieve the full effects of the present invention, the depth d of the recesses 15 must be precisely controlled. Thus $$d = w/2(n-1) - \Phi$$

Where
  w is the wavelength of the light transmitted through the finished mask,
  n is the index of refraction of the substrate, and
  Φ is a factor indicating the phase-shift, if any, and thickness of the attenuating material 19.

The height of the sidewall 16 or depth of the recesses is selected so that when incident light, in the frequency range of interest, is directed at the back side of the mask it exits the surface 11 on the top of the lands 18 between 160° and 200° degrees out off phase with the light exiting the top surface of the attenuation layer in the bottom of the recesses. Preferably and for the best possible results this phase-shift difference should be 180° (π radians).

This phase-shift occurs because the substrate modifies the phase of the light transmitted therethrough an amount that varies as a function of its refractive index and thickness. Thus knowing the phase of the light exiting from the top of the lands 18 and the change in the phase of any light passing through the attenuation layer 19 the depth of the recesses 15, sufficient to achieve this 180° (π radians) phase-shift of the light of the light passing through the layer 19 in the bottom of the recesses, can readily be established. The optical phase-shift due to the thickness of the attenuation layer and that due to the thickness of the substrate material below the recesses must co-act to shift the light emerging from the attenuating layer 19 to be approximately 180° (π radians) out of phase with respect to the light emerging from the top surface of the lands 18. As noted above, the described chrome oxide layer 19 induced a measured phase-shift of 20°, thus the depth of the recesses 15 must be sufficient to cause an additional shift of 160°.

The final mask created by the above fabrication process as shown in FIG. 7 is not susceptible to phase defects caused by over etched or under-etched areas in the quartz surface because the only surface subjected to etching or alteration is that region lying at the bottom of the recesses 15 and coated with the attenuating material 19. The quartz surface 11 of the transmissive lands 18, i.e., the printing regions of the finished mask, remains in its original condition since it is never been exposed to quartz enchants. Thus, any defects that might have occurred in the quartz surface, as a result of the mask making processes will be lying at the bottom of the recesses 15 and covered by attenuating material 19 and thus will not be printed or replicated in the final product produced by the mask.

Because the attenuating material is designed to transmit an exact amount of light and the depth of the recesses can be used to set the degree of phase-shift, the amount of attenuation and degree of phase-shift can be controlled independently.

This completes the description of the preferred embodiment of the invention. Since changes may be made in the above process without departing from the scope of the invention described herein, it is intended that all the matter contained in the above description or shown in the accompanying drawings shall be interpreted in an illustrative and not in a limiting sense. Thus other alternatives and modifications will now become apparent to those skilled in the art without departing from the spirit and scope of the invention as set forth in the following claims.

What is claimed is:

1. A semiconductor mask comprising:
   a substrate of a selected thickness, having first and second major surfaces and having a high light transmissivity for a selected range of light;
   a plurality of recesses, of a selected depth in said first major surface of said substrate, being separated by regions of said substrate of said selected thickness;
   each of said recesses having deposited therein a material of a thickness and light transmission value as to attenuate light of said selected range; and
   said selected depth of said recesses having a depth so that light of said selected range transmitted the substrate underlying said recesses and through said deposits exits between 160° and 200° out of phase with light, of said selected range, transmitted through said regions of said substrate of said selected thickness located adjacent said recesses.

2. The mask of claim 1 wherein said substrate is formed of quartz and said material is selected from the group comprising chromium, molybdenum, tungsten, titanium compounds, and chromium oxide.

3. The mask of claim 2 wherein each of said recesses has a depth equal to one half of the wave length of the incident light times the index of refraction of the substrate minus 1.

4. The mask of claim 1 wherein said substrate is formed of borosilicate glass and said material is selected from the group comprising chromium, molybdenum, tungsten, titanium, and chromium oxide.

5. The mask of claim 4 wherein each said recesses has a depth equal to one half of the wave length of the incident light times the index of refraction of the substrate minus 1.

6. The mask of claim 1 wherein said substrate is formed of quartz and said material is a 300 Å thick layer of chromium oxide.

7. The mask of claim 4 wherein each said recesses in said first major surface has a depth equal to one half of the wave length of the incident light times the index of refraction of the substrate minus 1 less a factor related to the phase-shift and the thickness of the material deposited in said recesses.

8. The mask of claim 1 wherein said substrate is formed of quartz and said material is a layer of chrome oxynitride.

9. A photolithographic mask comprising:
   a body of transmissive material, of a selected thickness, having substantially planar and parallel major surfaces;
   a plurality of recessed regions in one of said surfaces;
   said recessed regions being separated by regions of said selected thickness, and
   deposits of a selected thickness of attenuating material in said recessed regions material co-acts with the thickness of the substrate material below the recessed regions to shift the light passing therethrough sufficient to cause destructive interference with refracted light emitted from the adjacent transmissive regions of said selected thickness of the mask.

10. An optical transmission device comprising:
    a substrate of a first selected thickness having a high light transmissivity for a selected range of light and first and second substantially parallel major surfaces;
    a plurality of recesses of a selected depth in a first one of said major surfaces of said substrate;
    said recesses being separated by regions of said first thickness;
    each of said recesses having substantial vertical sidewalls and a bottom substantially parallel to said major surfaces;
    the thickness of said substrate between the bottom of said recesses and said second major surface being of a second thickness which is less than said first thickness,
    each of said recesses having deposited therein a body of material to attenuate incident light, of said selected range, transmitted therethrough, to between 1 and 35%; and
    said second thickness and the transmissivity and thickness of said body of material deposited in said recesses co-acting to phase-shift light of said selected range transmitted therethrough 160° to 200° out of phase with light, of said selected range, transmitted through portions of said substrate of said first thickness.

11. The device of claim 10 wherein said substrate is formed of quartz and said material is selected from the group comprising chromium, molybdenum, tungsten, titanium, and chromium oxide.

12. The device of claim 10 wherein each of said recesses has a depth equal to one half of the wave length of the incident light times the index of refraction of the substrate minus 1 less a factor related to the phase-shift and the thickness of the material deposited in said recesses.

13. The device of claim 10 wherein said phase-shift light is 180° ($\pi$ radians) out of phase with respect to said refracted light.

14. The device of claim 10 wherein said phase-shift light is between 160° and 200° out of phase with respect to said refracted light.

15. A method of forming a structure having high light transmittance regions and low light transmittance regions, the method comprising the steps of:
    a) providing a substrate having a high light transmissivity;
    b) forming a plurality of recesses of selected depth in said substrate, each of said recesses being defined by a bottom and one or more sidewalls;
    c) depositing a material on said bottom of said recesses, said material having a thickness and light transmissivity such that said recesses constitute low light transmittance regions; and
    d) wherein said thickness of said substrate, said selected depth of said recesses and said light transmissivity of said material are selected so that light transmitted through portions of said substrate located between said recesses exits said substrate and destructively interfers with light transmitted through said substrate via said recesses, as measured adjacent said sidewalls.

16. A method of forming a structure having high light transmittance regions and low light transmittance regions, the method comprising the steps of:

a) providing a substrate having a high light transmissivity;

b) forming a plurality of recesses of selected depth in said substrate, each of said recesses being defined by a bottom and one or more sidewalls and separated by lands; and c) depositing a material on said bottom of said recesses having a low light transmittance and having selected a thickness, wherein said selected thickness and the thickness of said substrate underlying said recess are chosen so as to shift incident light transmitted therethrough between 160° and 200° out of phase with light transmitted through said lands.

17. A method of forming a structure having high light transmittance regions and low light transmittance regions, the method comprising the steps of:

a) providing a substrate having first and second parallel major surfaces and a high light transmissivity;

b) coating said first surface with a substantially opaque layer;

c) defining said substantially opaque layer into a plurality of selected regions:

d) etching said first surface of the substrate, between said selected regions, to form a plurality of recesses in said substrate, each of said recesses being defined by a bottom and one or more sidewalls;

e) depositing a low light transmittance material over said selected regions and in said recesses;

f) coating said low light transmittance material with a negative resist;

g) exposing said negative resist through said substrate by flooding said second major side of said substrate with a frequency that will activate the photoresist;

h) baking and developing said photoresist to remove the unactivated photoresist to expose the coated defined regions, while leaving activated photoresist in said recesses;

i) removing the coating from said defined regions to expose the opaque material and the remaining opaque material; and j) removing the activated photoresist from said recesses.

18. The process of claim 17 wherein said thickness of said substrate, said depth of said recesses and said light transmissivity of said material are selected so that light transmitted through portions of said substrate located between said recesses destructively interfers with light transmitted through said substrate and said material.

* * * * *